United States Patent
Brissot et al.

(10) Patent No.: US 6,933,585 B2
(45) Date of Patent: Aug. 23, 2005

(54) COLOR IMAGE SENSOR ON TRANSPARENT SUBSTRATE AND METHOD FOR MAKING SAME

(75) Inventors: Louis Brissot, Egreve (FR); Eric Pourquier, Voreppe (FR)

(73) Assignee: Atmel Grenoble S.A., Saint Egreve (FR)

( * ) Notice: Subject to any disclaimer, the term of this patent is extended or adjusted under 35 U.S.C. 154(b) by 0 days.

(21) Appl. No.: 10/485,694

(22) PCT Filed: Aug. 30, 2002

(86) PCT No.: PCT/FR02/02977
§ 371 (c)(1),
(2), (4) Date: Feb. 3, 2004

(87) PCT Pub. No.: WO03/019667
PCT Pub. Date: Mar. 6, 2003

(65) Prior Publication Data
US 2004/0188792 A1 Sep. 30, 2004

(30) Foreign Application Priority Data
Aug. 31, 2001 (FR) .............................. 01 11335

(51) Int. Cl.[7] ......................................... H01L 31/0203
(52) U.S. Cl. ...................... 257/434; 257/440; 257/439; 257/433; 257/443; 257/444; 257/464; 438/48; 438/54; 438/69
(58) Field of Search ................................ 257/432, 428, 257/431–435, 434, 439, 440, 443, 444, 464; 438/48, 54, 69

(56) References Cited

U.S. PATENT DOCUMENTS

| | | | |
|---|---|---|---|
| 4,758,734 A | | 7/1988 | Uchida et al. ............ 250/208.1 |
| 4,976,802 A | * | 12/1990 | LeBlanc .................. 156/273.5 |
| 5,244,817 A | * | 9/1993 | Hawkins et al. ............... 438/64 |
| 5,274,250 A | | 12/1993 | Miyake et al. ................ 257/59 |
| 6,204,087 B1 | | 3/2001 | Parker et al. ................. 438/56 |
| 6,257,491 B1 | | 7/2001 | Fazekas et al. ........ 235/462.36 |

* cited by examiner

Primary Examiner—Nathan J. Flynn
Assistant Examiner—Scott R. Wilson
(74) Attorney, Agent, or Firm—Lowe Hauptman & Berner, LLP

(57) ABSTRACT

The invention concerns a color image sensor that can be used to make a miniature camera, and a corresponding method for making this sensor.

The image sensor comprises a transparent substrate (40) on the upper part of which are superimposed, successively, a mosaic of color filters (18), a very thin silicon layer (30) comprising photosensitive zones, and a stack of conductive layers (14) and insulating layers (16) defining image detection circuits enabling the collection of the electrical charges generated by the illumination of the photosensitive zones through the transparent substrate. The manufacturing method consists in producing the photosensitive circuits on a silicon wafer, transferring said wafer on to a temporary substrate, thinning the wafer down to a thickness of about three to 30 micrometers, depositing color filters on the surface of the remaining silicon layer and transferring the structure to a permanent transparent substrate and eliminating the temporary substrate.

15 Claims, 3 Drawing Sheets

COLOR IMAGE SENSOR ON TRANSPARENT SUBSTRATE AND METHOD FOR MAKING SAME

The invention relates to electronic image sensors, and especially to very small-sized sensors with dimensions that enable the making of miniature cameras such as those that are to be incorporated into a portable telephone.

Apart from great compactness, the image sensor should have high sensitivity under weak light and high colorimetrical performance.

Furthermore, the entire camera needs to be made by the most economical methods possible so as not to make the apparatus prohibitively costly.

To achieve this result, it is sought firstly to make the image sensor and the electronic processing circuits if possible on a same silicon substrate and secondly, as far as possible, to carry out the deposition of the different layers, the etching operations, the heat-processing operations etc. collectively on a silicon wafer comprising many identical sensors, and then dice the wafer into individual sensors.

However, the methods hitherto proposed for making color image sensors and the structures of these sensors are not entirely satisfactory from this viewpoint. The methods of manufacture are not industrially efficient; they remain far too costly and their efficiency is far too low for large-scale manufacturing applications, or else the performance of the image sensor is not high enough.

The present invention proposes a method of manufacture and a corresponding image sensor that minimizes the costs of manufacture while presenting excellent quality and especially compactness, high sensitivity and high colorimetrical performance.

To this end, the invention propose a method for making an image sensor, comprising:

the formation, on the front face of a semiconductive wafer, of a series of active zones comprising image detection circuits and each corresponding to a respective image sensor, each active zone being surrounded by input/output pads, the transfer of the wafer by its front face against the front face of a temporary supporting substrate, the elimination of the major part of the thickness of the semiconductive wafer, leaving a very fine semiconductive layer on the substrate, this fine semiconductive layer comprising the image detection circuits, this method being characterized in that firstly, layers of color filters are deposited and then etched on the semiconductive layer thus thinned, secondly, after the etching of the color filters, the entire temporary substrate and wafer are transferred to a permanent, transparent substrate applied on the side of the temporary substrate that bears the color filters, then, at least the major part of the temporary substrate is removed, to enable easy access to the input/output pads, and finally, the substrate is diced into individual sensors.

The semiconductive material of the thinned layer is preferably a monocrystalline material, and especially silicon for the most usual applications in visible light.

The temporary substrate may be entirely removed, baring the input/output pads to which the outward connections of the sensor may then be connected. But it is also possible to remove it only partially, leaving a thin layer that protects the semiconductive wafer. In this case, apertures need to be formed in this fine layer to access the input/output pads.

Preferably, the active zones comprise a matrix of photosensitive elements as well as control circuits of the matrix and associated image-processing circuits receiving signals coming from the photosensitive elements of the active area. The circuits thus associated with the matrix are preferably masked against light by a layer of aluminum, only the matrix being exposed to light. This aluminum layer is formed on the transparent substrate.

The transfer of the semiconductive wafer to the temporary substrate can be done by gluing, classic soldering, anodic bonding or by simple molecular adhesion (i.e. through the very great force of contact between two surfaces having great planeity). The transfer from the temporary substrate to the permanent substrate will preferably be done by bonding or by molecular adhesion.

The thinning of the semiconductive wafer after transfer to the substrate and before the deposition of the filters can be done in many different ways: thinning by lapping, chemical thinning, a combination of both types of thinning (firstly mechanical thinning and then chemical finishing or else mechanical machining in the presence of chemicals). The thinning can also be done by a preliminary embrittlement of the wafer at the desired dicing level, in particular by in-depth hydrogen implantation in the desired dicing plane. In this case, the hydrogen implantation is done at a shallow depth in the semiconductive wafer before the transfer of the wafer to the substrate. The thinning is then done by heat processing which dissociates the wafer at the level of the implanted dicing plane, leaving a thin semiconductive layer in contact with the substrate.

The very great thinning of the wafer reduces its thickness from several hundreds of micrometers before transfer to the substrate to 3 to 20 micrometers after transfer to the substrate. Thinning is a major factor in the quality of the sensors since it improves colorimetrical performance and sensitivity. With non-thinned sensors, illuminated by the side in which there are formed the numerous insulating and conductive layers that serve to define the image detection circuits, the light that has crossed a color filter is scattered on photosensitive dots corresponding to different colors, lowering colorimetrical performance. Furthermore, the sensitivity of a thin sensor is improved because the photons reach a wider silicon region than in the case of the non-thinned sensors, since they are not stopped by the metal layers which are opaque and take up a large part of the surface area corresponding to each photosensitive dot.

It will be understood that the thinning, however, complicates the problems of manufacture because, after thinning, the silicon loses its rigidity and becomes very brittle, and that, furthermore, there arises the problem of connecting the image detection circuits with the exterior. The solution of the invention mitigates this difficulty and enables the making of the image sensors with high efficiency.

In the permanent sensor, the light is received through the transparent permanent substrate, the connection pads being located on the other side, thus enabling the sensor to be mounted by the flip-chip technique (in which the chip is upside down with the connection pads against the printed circuit board). The light losses through the transparent substrate (made of glass or plastic) are low.

The permanent substrate and the silicon layer are in close contact and the active circuit elements of the wafer are therefore well protected.

For example, the thickness of the permanent substrate is about 500 micrometers for a substrate with a diameter of 15 to 20 centimeters; the thickness of the silicon wafer ranges from 500 to 1000 micrometers before thinning (with a diameter of 15 to 30 centimeters), and then from 3 to 20 micrometers after thinning.

Planarization layers, made of polyimide for example, may be deposited on the silicon wafer before transfer to the intermediate substrate and before the transfer of the intermediate substrate to the permanent substrate.

It must be noted that the intermediate substrate in certain cases can be re-used from one manufactured batch to another.

An object of the invention therefore is an image sensor comprising a transparent substrate, on the upper part of which the following are superimposed successively a mosaic of color filters, a very thin monocrystalline semiconductive layer (with a maximum thickness of some tens of micrometers) (30) in which there is formed a matrix array of photosensitive zones, and a stack of insulating and conductive layers enabling the collection of the electrical charges generated by the illumination of the photosensitive zones through the transparent substrate, so that the light passes, successively, through the transparent substrate, then the color filters, then the photosensitive semiconductive zones, and then the stack of insulating and conductive layers, without encountering a system of conductive layers, before reaching the array of photosensitive zones.

The transparent substrate is preferably made of glass or plastic but may also be made of ceramic or of crystalline material.

Other features and advantages of the invention shall appear from the following detailed description, made with reference to the appended drawings, of which:

FIG. 1 shows the general structure of the silicon wafer on which classic techniques have been used to make the image detection circuits of a multiplicity of image sensors.

The silicon wafer 10 has a thickness of several hundreds of micrometers, for a diameter of 150 to 300 millimeters.

Figure 1:
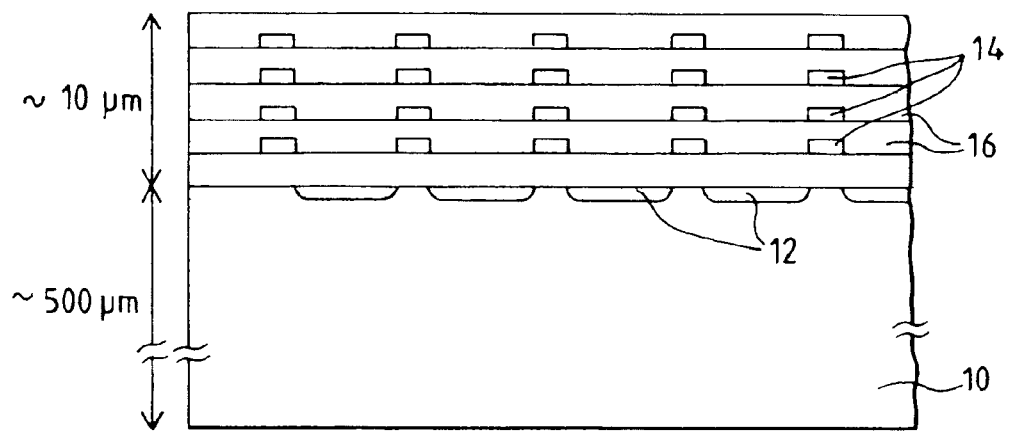
FIG. 1 shows the structure of an image sensor made on a silicon wafer before the positioning of color filters.

The image detection circuits (the matrix of photosensitive dots, transistors and interconnections) are fabricated on one face of the silicon wafer, which may be called the front face and is the upper face in FIG. 1. Fabrication implies, firstly, various operations of diffusion and implantation in the silicon, from the upper face of the wafer, to form especially photosensitive zones 12, and, secondly, successive operations for the deposition and etching of conductive layers 14 and insulating layers 16 forming a stack on top of the photosensitive zones 12. The insulating and conductive layers form part of the image detection circuits and enable the collection of electrical charges generated in the photosensitive zones by an image projected on the sensor.

One of the conductive layers 14, in principle the layer deposited last, serves to form input/output pads of each individual sensor (the pads cannot be seen in FIG. 1) around the active zone comprising the matrix of photosensitive dots.

If the sensor were to be made by means of a classic technology, then a mosaic of color filters would be deposited on the surface of the wafer.

Figure 2:
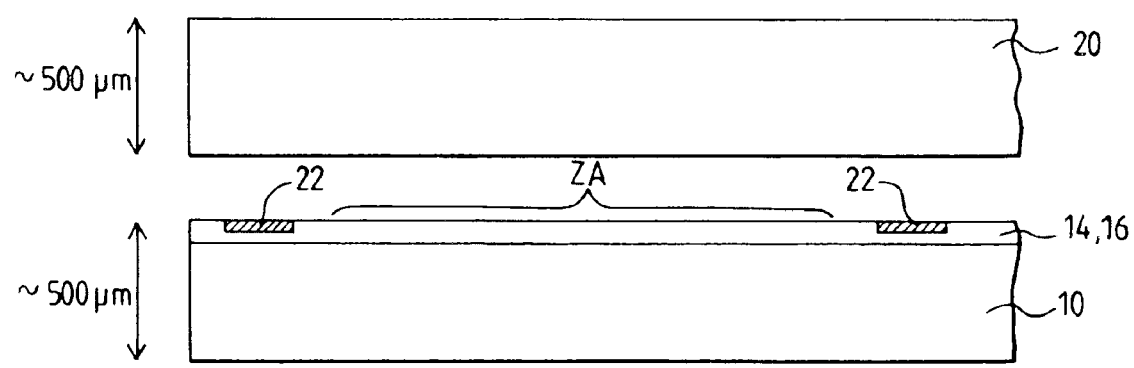
FIG. 2 shows the operation of the transfer of the silicon wafer by its front face to a temporary substrate.

According to the invention, no color filters are deposited at this stage but the wafer is transferred by its front face to a temporary substrate 20 (FIG. 2). The temporary substrate 20 is a wafer having the same diameter as the wafer 10 and a similar thickness to ensure the rigidity of the structure while it is being made. It may furthermore be constituted by another silicon wafer. The transfer can be done after the deposition of a planarization layer serving to fill the relief features created on the front face of the silicon wafer by the operations of deposition and etching of the stack of conductive and insulating layers. This planarization layer does not need to be transparent FIG. 2 represents the structure on a smaller scale than that of FIG. 1 in order to show the entire individual sensor comprising an active zone ZA and connection pads 22 around the active zone ZA. The pads 22, in contact with a conductive layer 14 or forming part of the layer 14, are preferably flush with the interface between the two wafers 10 and 20; if a planarization layer has been deposited, it is preferably ensured that it does not cover the pads 22. However, if the pads are covered by the planarization layer, it will subsequently be seen that apertures can in any case be made to access these pads at the end of the fabrication process.

The transfer of the silicon wafer to the supporting wafer 20 can be done by several means. The simplest means could be quite simply that of holding the wafer by molecular adhesion, since the great planeity of the surfaces in contact generates very high contact forces. Gluing is also possible.

Figure 3:
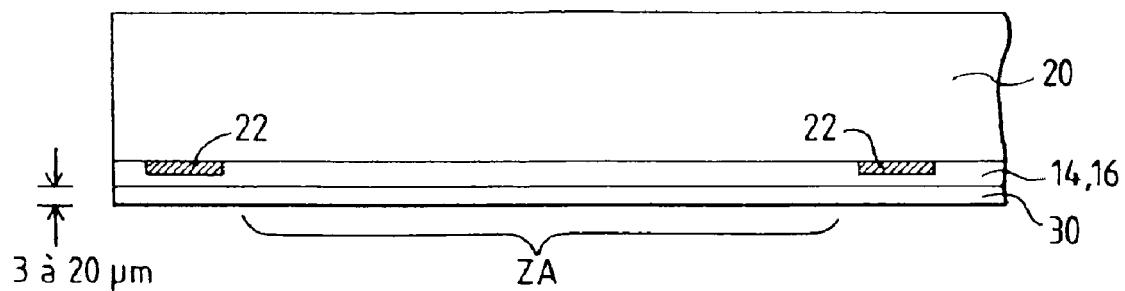
FIG. 3 shows the temporary substrate with the silicon wafer after thinning of the wafer.

After the silicon wafer has been transferred by the front face to the supporting wafer, the major part of the thickness of the silicon wafer is eliminated so as to leave only a thickness of about 8 to 30 micrometers, including the thickness of the stack of layers. What remains of the silicon wafer is no more than a superimposition of a few micrometers (5 to 10 micrometers for example) for the stack of layers 14, 16 and about three to 20 micrometers for the remaining silicon thickness, including the photosensitive areas 12. The remaining thickness is that of the layer 30 of FIG. 3 containing the photosensitive zones 12 of FIG. 1.

The thinning operation can be done by mechanical machining (lapping) terminated by chemical machining, or by mechanical/chemical machining, or by chemical machining only, or again by a particular method of separation necessitating a preliminary implantation of an embrittling impurity in the plane that will demarcate the thinned silicon layer.

In the case of this separation by implantation of impurities, the implantation must be done before the transfer of the silicon wafer to the supporting wafer. Indeed, the implantation is done by the front face of the silicon wafer, throughout the surface of the wafer and at a depth that will define the dicing plane. The preliminary implantation is preferably hydrogen implantation. It can be done at various stages of the making of the wafer, but the separation of the thickness of the wafer along the implanted dicing plane can be done only when the silicon wafer has been attached to the supporting wafer.

The upper surface of the thinned silicon layer 30 can be processed (fine lapping, chemical cleaning, mechanical/ chemical polishing, etc.) in order to eliminate the surface defects, after which the color filters can be deposited and etched, leading to a multiple-sensor wafer whose general structure is that of FIG. 2.

Figure 4:
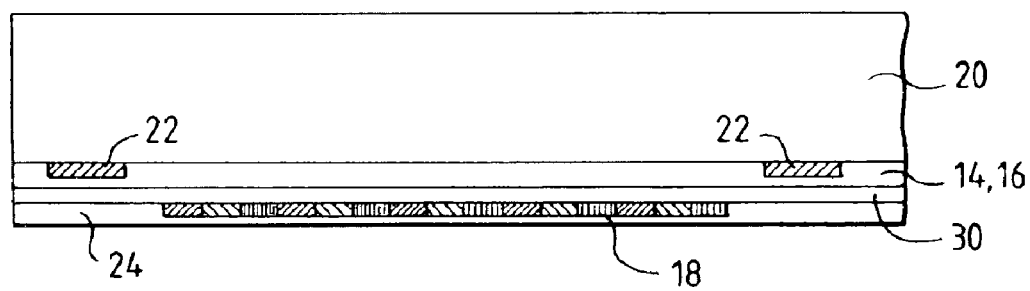
FIG. 4 shows the temporary substrate, bearing the thinned silicon layer on which a mosaic of color filters has been deposited.

A mosaic of color filters 18 is then deposited on the surface of the layer 30 (FIG. 4). If desired, one or more additional layers can be deposited before the deposition of the color filters, especially passivation layers, anti-reflection layers and other layers, for example layers needed for the electrical activation of the doped silicon layers (electrical polarization layers).

Figure 5:
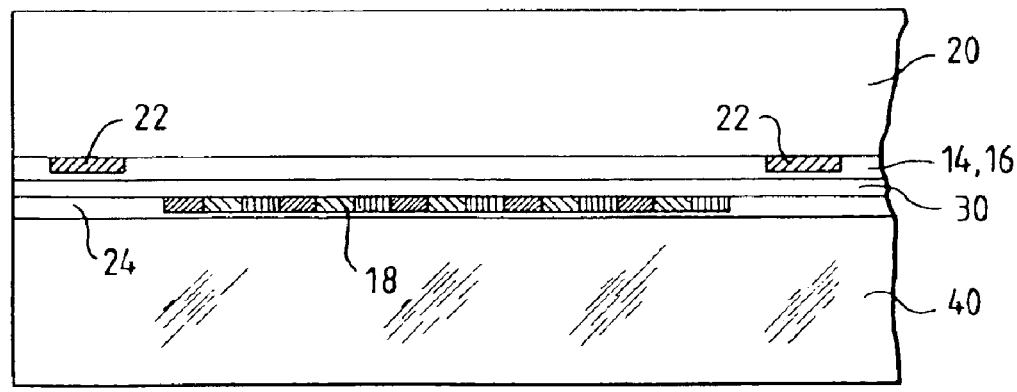
FIG. 5 shows the permanent substrate to which the temporary substrate is transferred by its face bearing the colored filters.

If necessary, a planarization layer 24 is deposited on the mosaic of filters. It must be transparent if it covers the filters. The temporary substrate 20 is then transferred, by its front face bearing the color filters, to a permanent transparent substrate 40 (made of glass or plastic), in the form of a wafer having a diameter identical to that of the temporary substrate and the initial silicon wafer. The thickness of the permanent substrate is equal to a few hundreds of micrometers at least, to make it possible to ensure the rigidity of the structure during fabrication. (FIG. 5).

The transfer of the temporary substrate to the permanent substrate is done by gluing (with transparent glue) or by molecular adhesion.

The major part or even the totality of the temporary substrate 20 is eliminated by mechanical and/or chemical means, or by embrittlement by hydrogen implantation for example as already explained. In this case, to partially remove the substrate 20, the hydrogen implantation in the supporting wafer 20 must be done prior to the first transfer of the silicon wafer to the wafer 20. This implies that, between the transfer to the wafer 20 and the transfer to the substrate 80, no operation is performed at temperatures liable to cause a break at the hydrogen implantation plane.

Figure 6:
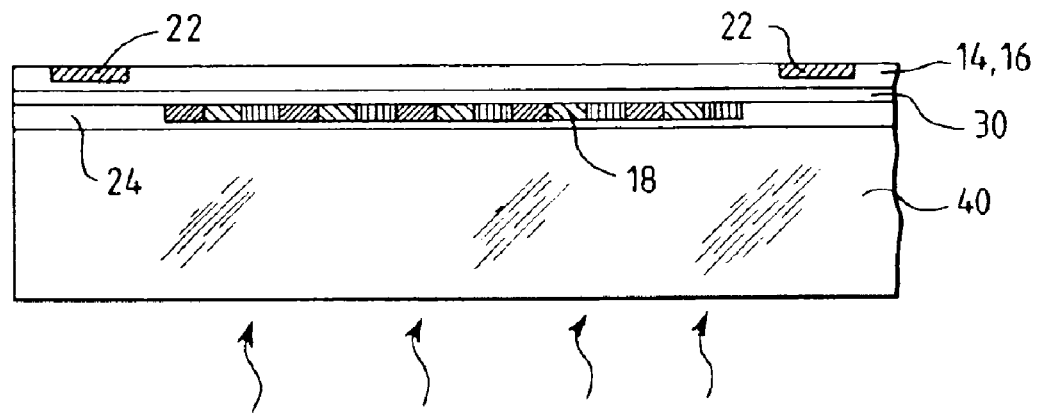
FIG. 6 shows the permanent substrate after the elimination of the totality of the thickness of the temporary substrate.

In the case shown in FIG. 6, the substrate 20 is totally eliminated until the connection pads 22 are made flush with the surface of the structure.

Figure 7:
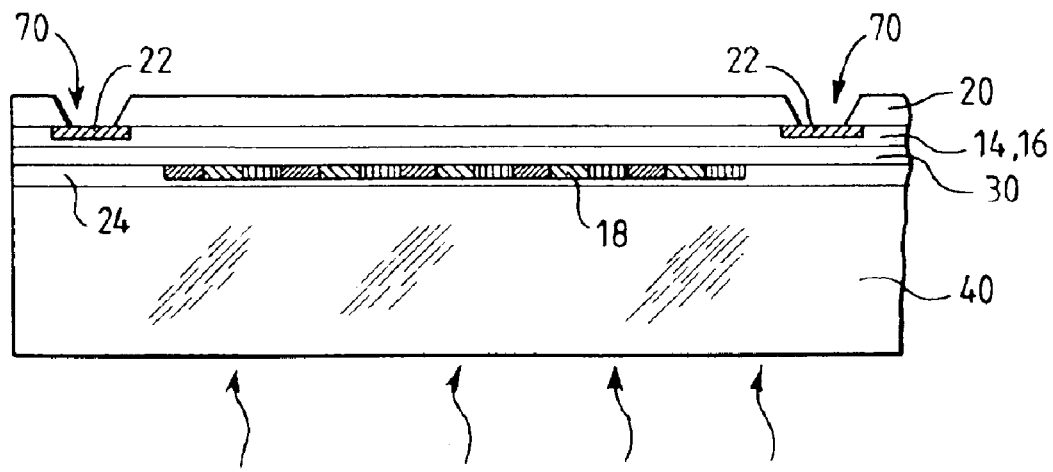
FIG. 7 shows an alternative embodiment from which the major part but not the totality of the temporary substrate has been removed, and in which access apertures to contacts have been formed.

In the case of FIG. 7, the elimination of the substrate 20 is only partial. There remains a small thickness (some micrometers at most if possible) in which chemical corrosion or other means will be used to form apertures 70 to open up regions of access to the connection pads 22.

The connection pads in the case of FIG. 7 may be used for a "wire-bonding" type of connection with a printed circuit board. Since the light must penetrate from the transparent permanent substrate 40 side, the printed circuit board must then be open so as to be facing the photosensitive active zone of the sensor.

In case of FIG. 6, the connection pads 22 are flush with the level of the upper surface of the image sensor. They may be used either for a "wire-bonding" type connection or for a "flip-chip" type of connection (the chip being placed upside down with the connection pads against the corresponding pads of the printed circuit board). In this case, the sensor is illuminated through the top of the printed circuit board.

If it were desired all the same to use a flip-chip type of assembly for the sensor shown in FIG. 7, in which the connection pads 22 are pushed into the apertures 70, the following procedure would be used: an additional metallization would be deposited and etched, this metallization resting on the outer surface of the structure (i.e. on the upper surface of the remaining portion of substrate 20 in which apertures 70 have been formed) as well as at the bottom of the apertures 70. The external connection pads of the structure would then be formed outside the apertures 70.

In these different embodiments, the structure formed on the substrate 40 may be tested on the wafer by means of the connection pads. The test may be performed in the presence of light, image patterns, etc.

The structure is diced into individual sensors for packaging only at the end of this fabrication process.

The permanent substrate, applied closely against the thinned silicon layer bearing the color filters, protects both the filters and the silicon.

What is claimed is:

1. A method for making an image sensor, comprising the steps of:

forming, on the front face of a semiconductive wafer, a series of active zones comprising image detection circuits each corresponding to a respective image sensor, each active zone being surrounded by input/output pads, then, transferring of the wafer by its front face against the front face of a temporary supporting substrate;

then, eliminating a major part of the thickness of the semiconductive wafer, leaving a very fine semiconductive layer on the substrate, this fine semiconductive layer comprising the image detection circuits;

then, layers of color filters are deposited and then etched on the semiconductive layer thus thinned, then, after the etching of the color filters, the temporary substrate is are transferred to a transparent, permanent substrate applied on the side of the temporary substrate that bears the color filters, then, at least the major part of the temporary substrate is removed, to enable easy access to the input/output pads, and finally, the substrate is diced into individual sensors.

2. The method according to claim 1, wherein the temporary substrate is entirely removed, baring the input/output pads.

3. The method according to claim 1, wherein the temporary substrate is partially removed, leaving a thin layer that protects the semiconductive wafer, and apertures are formed in this fine layer to access the input/output pads.

4. The method according to claim 1, wherein the semiconductive layer after thinning has a thickness of about 3 to 20 micrometers.

5. The method according to claim 1, wherein a planarization layer is deposited on the semiconductive wafer before transfer to the temporary substrate.

6. The method according to claim 1, wherein a transparent planarization layer is deposited on the thinned semiconductive layer before transfer from the intermediate substrate to the permanent substrate.

7. An image sensor comprising:

a transparent substrate on the upper part of which the following are superimposed, successively, a mosaic of color filters, a very thin monocrystalline semiconductive layer in which there is formed a matrix array of photosensitive zones, and a stack of conductive layers and insulating layers enabling the collection of the electrical charges generated by the illumination of the photosensitive zones through the transparent substrate, so that the light passes, successively, through the transparent substrate, then the color filters, then the photosensitive semiconductive zones, and then the stack of insulating and conductive layers, without encountering a system of conductive layers, before reaching the array of photosensitive zones.

8. The image sensor according to claim 7, wherein the transparent substrate is made of glass, plastic or crystalline material.

9. The method according to claim 2, wherein a planarization layer is deposited on the semiconductive wafer before transfer to the temporary substrate.

10. The method according to claim 3, wherein a planarization layer is deposited on the semiconductive wafer before transfer to the temporary substrate.

11. The method according to claim 4, wherein a planarization layer is deposited on the semiconductive wafer before transfer to the temporary substrate.

12. The method according to claim 2, wherein a transparent planarization layer is deposited on the thinned semiconductive layer before transfer from the intermediate substrate to the permanent substrate.

13. The method according to claim 3, wherein a transparent planarization layer is deposited on the thinned semiconductive layer before transfer from the intermediate substrate to the permanent substrate.

14. The method according to claim 4, wherein a transparent planarization layer is deposited on the thinned semiconductive layer before transfer from the intermediate substrate to the permanent substrate.

15. The method according to claim 5, wherein a transparent planarization layer is deposited on the thinned semiconductive layer before transfer from the intermediate substrate to the permanent substrate.

* * * * *